(12) United States Patent
Sundaresh et al.

(10) Patent No.: US 11,650,234 B2
(45) Date of Patent: May 16, 2023

(54) CLASSIFICATION OF MAGNET TAMPERING CONDITIONS ON A METERING DEVICE

(71) Applicant: Honeywell International Inc., Morris Plains, NJ (US)

(72) Inventors: Nagaraja Sundaresh, Karnataka (IN); Shalu Singhvi, Hyderabad (IN); Rajesh Mahapatra, Telangana (IN); Anil Bhide, Telangana (IN)

(73) Assignee: Honeywell International Inc., Charlotte, NC (US)

( * ) Notice: Subject to any disclaimer, the term of this patent is extended or adjusted under 35 U.S.C. 154(b) by 0 days.

(21) Appl. No.: 17/387,948

(22) Filed: Jul. 28, 2021

(65) Prior Publication Data

US 2023/0030025 A1 Feb. 2, 2023

(51) Int. Cl.
  *G01R 22/06* (2006.01)
(52) U.S. Cl.
  CPC ................. *G01R 22/066* (2013.01)
(58) Field of Classification Search
  CPC ......... G01R 11/00; G01R 11/02; G01R 11/24; G01R 22/00; G01R 22/06; G01R 22/061; G01R 22/066
  See application file for complete search history.

(56) References Cited

U.S. PATENT DOCUMENTS

| 7,126,330 | B2 | 10/2006 | Peczalski et al. |
| 7,495,555 | B2 | 2/2009 | Seal et al. |
| 9,658,254 | B2 | 5/2017 | Ramirez |
| 2005/0122217 | A1* | 6/2005 | Seal .................. G01R 22/066 340/568.1 |
| 2011/0115642 | A1* | 5/2011 | Gilbert ............... G01R 22/066 340/635 |
| 2012/0074927 | A1* | 3/2012 | Ramirez ............. G01R 22/066 324/110 |

(Continued)

FOREIGN PATENT DOCUMENTS

EP 1532457 A1 5/2005

OTHER PUBLICATIONS

Three-Axis Magnetic Sensor HMC1043, Honeywell, 2010.
"Magnet Sensor Product Catalog", Honeywell.

*Primary Examiner* — Huy Q Phan
*Assistant Examiner* — David B Frederiksen
(74) *Attorney, Agent, or Firm* — Ortiz & Lopez, PLLC; Luis M. Ortiz; Kermit D. Lopez

(57) ABSTRACT

A method and system for detecting tampering of an energy meter can involve, in a first phase: gathering magnetic field sample data, an average magnetic field strength, a minimum magnetic field strength, and a maximum magnetic field strength from a magnetic field condition applied to an energy meter by a magnetic sensor that measures a magnetic field in one or more directions, and using learning coefficients calculated from the magnetic field sample data and the average magnetic field strength, the minimum magnetic field strength, and the maximum magnetic field strength to classify with a classifier, magnet tampering conditions with respect to the energy meter. In a second phase, a magnet tamper event can be identified with respect to the energy meter when the magnet tampering condition classified by the classifier is greater than a magnetic detection threshold.

17 Claims, 6 Drawing Sheets

(56) References Cited

U.S. PATENT DOCUMENTS

| | | | |
|---|---|---|---|
| 2012/0130681 A1* | 5/2012 | Pride | G01R 22/066 |
| | | | 324/76.77 |
| 2013/0088353 A1* | 4/2013 | LaFrance | G01R 11/24 |
| | | | 340/551 |
| 2014/0019384 A1* | 1/2014 | Hanley | G06Q 50/06 |
| | | | 705/412 |
| 2015/0286846 A1* | 10/2015 | Prakash | G01D 4/004 |
| | | | 726/34 |
| 2016/0084632 A1* | 3/2016 | Zigovszki | G01R 11/24 |
| | | | 324/207.11 |
| 2018/0052008 A1* | 2/2018 | Maman | G06V 10/141 |

* cited by examiner

CLASSIFICATION OF MAGNET TAMPERING CONDITIONS ON A METERING DEVICE

TECHNICAL FIELD

Embodiments are generally related to the monitoring and prevention of energy theft resulting from tampering of energy meters, such as electricity meters and gas meters. Embodiments also relate to methods and systems for detecting tampering of an energy meter. Embodiments also relate to the classification of magnet tampering conditions for use in monitoring and detecting energy meter tampering.

BACKGROUND

Energy theft is a worldwide problem with significant impacts to revenue losses for utilities and paying customers. In India, for example, "transmission losses" due to illegal connections or tampering can consume up to 42% of total electricity production.

Electricity meter tampering is an illegal method that involves various ways to bypass the meter and altering the connections to the meter or tampering with the operation of the meter itself with the goal of reduction in the amount of consumption registered. One of the major tampering techniques encountered in the energy meter is application of strong magnetic fields.

Electricity meters use magnetic materials for current measurement circuits and are susceptible to abnormal external magnetic field influences (e.g., alternating current, direct current), which can introduce significant errors in measurement. A strong magnet can saturate the magnetic cores of the sensor resulting in an erroneous output or can disable the meter completely by interfering with its power-supply transformer resulting in less effective billing.

One technique for avoiding this problem can involve shielding the current sensors (CTs), and placing a metallic plate known as a Rogowski coil inside the meter, which can result in increased system costs, manufacturability complexity and weight of the meter. Rogowski coils have excellent linearity and can sense very high currents but may be more difficult to manufacture and increase challenges in achieving sufficient noise immunity necessary for accurate low current measurements. From a tamper perspective, Rogowski coils are also susceptible to alternating-current (AC) magnetic fields. Furthermore, Hall-effect sensors may be required to active the compensation of offset over temperature and are inherently susceptible to magnetic fields.

Another technique can involve the use of a shunt resistor, which may be cost effective and immune to direct current (DC) magnetic fields as there is no magnetic element. Shunt resistors, however, are subject to influence under AC magnetic fields, which can introduce errors in measurement.

The use of Hall effect sensors, which can detect fixed Magnetic thresholds (i.e., only DC magnets) is inefficient in detecting tampering due to the AC magnet because the varying fields may fail to register on these sensors. Multiple linear Hall sensors may be needed to monitor the entire environment. This approach leads to higher system costs.

Another disadvantage of existing solutions is the detection and reporting of stray magnetic fields (e.g., a magnet used in an optical reader if magnet detection threshold is set very low or it does not record true tamper events if a threshold is set high).

Energy meters have very stringent cost targets and adding hardware for detection and immunity can adversely impact the cost of the meter, which makes solutions such as described above uncompetitive and impractical.

BRIEF SUMMARY

The following summary is provided to facilitate an understanding of some of the features of the disclosed embodiments and is not intended to be a full description. A full appreciation of the various aspects of the embodiments disclosed herein can be gained by taking the specification, claims, drawings, and abstract.

It is, therefore, one aspect of the disclosed embodiments to provide for the detection of tampering with an energy meter.

It is another aspect of the disclosed embodiments to provide for methods and systems for the classification of magnet tampering conditions associated with an energy meter.

It is a further aspect of the disclosed embodiments to provide for methods and systems for detecting a magnetic tampering of an energy meter using a classifier and a magnetic sensor.

The aspects and other objectives can now be achieved as described herein. In an embodiment, a method for detecting tampering of an energy meter, can involve: in a first phase: gathering magnetic field sample data, an average magnetic field strength, a minimum magnetic field strength, and a maximum magnetic field strength from at least one magnetic field condition applied to an energy meter by a magnetic sensor that measures a magnetic field in at least one of a plurality of directions; using learning coefficients calculated from the magnetic field sample data and the average magnetic field strength, the minimum magnetic field strength, and the maximum magnetic field strength to classify with a classifier, magnet tampering conditions with respect to the energy meter; and in a second phase: identifying a magnet tamper event with respect to the energy meter when the magnet tampering condition classified by the classifier is greater than a magnetic detection threshold.

In an embodiment of the method, the first phase can involve a learning phase.

In an embodiment of the method, the second phase can involve a detection phase.

In an embodiment of the method, the second phase can involve: measuring the magnetic field in the at least one of the plurality of directions by taking a plurality of samples with the magnetic sensor; calculating the average magnetic field strength, the minimum magnetic field strength, and the maximum magnetic field strength; and applying thresholds to the magnet tampering conditions including at least one of: an AC tamper condition and a DC tamper condition.

In an embodiment of the method, the second phase can further involve: performing a classification using the classifier; and making a final decision regarding the magnet tampering condition classified by the classifier including a type of magnet tamper event.

In an embodiment of the method, the second phase can involve: measuring the magnetic field in the at least one of the plurality of directions by taking a plurality of samples with the magnetic sensor; calculating the average magnetic field strength, the minimum magnetic field strength, and the maximum magnetic field strength; applying thresholds to the magnet tampering conditions including at least one of: an AC tamper condition and a DC tamper condition; performing a classification using the classifier; and making a final decision regarding the magnet tampering condition classified by the classifier including a type of magnet tamper event.

In an embodiment of the method, the magnetic sensor can comprise a 3D magnetic sensor.

An embodiment of the method can further involve detecting a magnet type based on the calculating of the average magnetic field strength, the minimum magnetic field strength, and the maximum magnetic field strength.

In another embodiment, a system for detecting tampering of an energy meter, can include an energy meter and a magnetic sensor that measures a magnetic field in at least one of a plurality of directions, wherein: in a first phase: the magnet sensor gathers magnetic field sample data, an average magnetic field strength, a minimum magnetic field strength, and a maximum magnetic field strength from at least one magnetic field condition applied to the energy meter by the magnetic sensor; a classifier uses learning coefficients calculated from the magnetic field sample data and the average magnetic field strength, the minimum magnetic field strength, and the maximum magnetic field strength to classify magnet tampering conditions with respect to the energy meter; and in a second phase: a magnet tamper event is identified with respect to the energy meter when the magnet tampering condition classified by the classifier is greater than a magnetic detection threshold.

In an embodiment of the system, the first phase can comprise a learning phase.

In an embodiment of the system, the second phase can comprise a detection phase.

In an embodiment of the system, the second phase can further involve: measuring the magnetic field in the at least one of the plurality of directions by taking a plurality of samples with the magnetic sensor; calculating the average magnetic field strength, the minimum magnetic field strength, and the maximum magnetic field strength; and applying thresholds to the magnet tampering conditions including at least one of: an AC tamper condition and a DC tamper condition.

In an embodiment of the system, the second phase can further involve performing a classification using the classifier; and making a final decision regarding the magnet tampering condition classified by the classifier including a type of magnet tamper event.

In an embodiment of the system, the second phase can involve: measuring the magnetic field in the at least one of the plurality of directions by taking a plurality of samples with the magnetic sensor; calculating the average magnetic field strength, the minimum magnetic field strength, and the maximum magnetic field strength; applying thresholds to the magnet tampering conditions including at least one of: an AC tamper condition and a DC tamper condition; performing a classification using the classifier; and making a final decision regarding the magnet tampering condition classified by the classifier including a type of magnet tamper event.

In an embodiment of the system, the magnetic sensor can comprise a 3D magnetic sensor.

In an embodiment of the system, a magnet type can be detected based on the calculating of the average magnetic field strength, the minimum magnetic field strength, and the maximum magnetic field strength.

In another embodiment, a non-transient, computer-readable storage medium can be provided having instructions stored thereon that when executed by a computer system cause the computer system to: in a first phase: gather magnetic field sample data, an average magnetic field strength, a minimum magnetic field strength, and a maximum magnetic field strength from at least one magnetic field condition applied to an energy meter by a magnetic sensor that measures a magnetic field in at least one of a plurality of directions; use learning coefficients calculated from the magnetic field sample data and the average magnetic field strength, the minimum magnetic field strength, and the maximum magnetic field strength to classify with a classifier, magnet tampering conditions with respect to the energy meter; and in a second phase: identify a magnet tamper event with respect to the energy meter when the magnet tampering condition classified by the classifier is greater than a magnetic detection threshold.

BRIEF DESCRIPTION OF THE DRAWINGS

The accompanying figures, in which like reference numerals refer to identical or functionally-similar elements throughout the separate views and which are incorporated in and form a part of the specification, further illustrate the present invention and, together with the detailed description of the invention, can explain the principles of the present invention.

DETAILED DESCRIPTION

Figure 1:
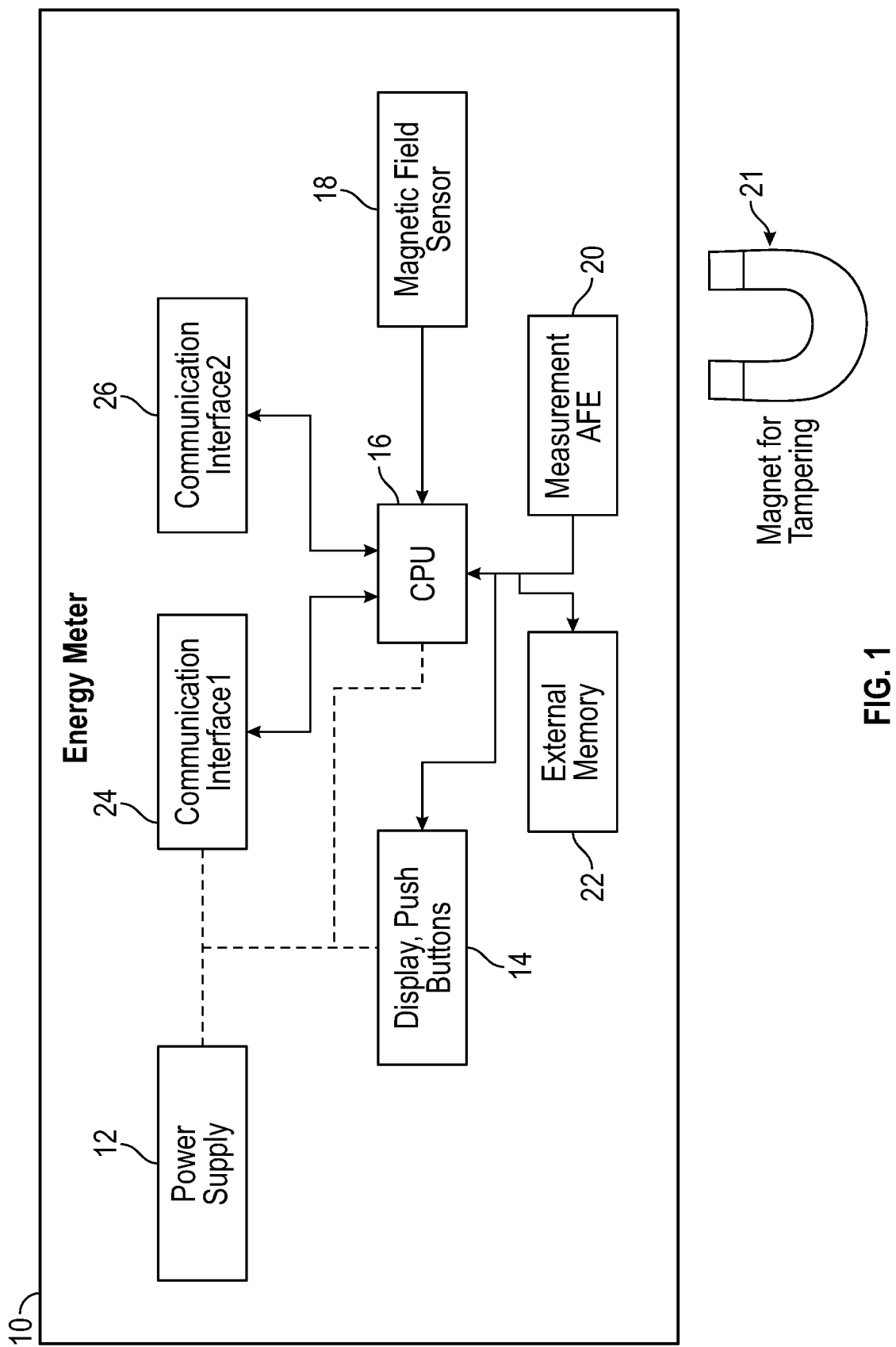
FIG. 1 illustrates a block diagram of an energy meter that can perform measurement, billing and communications over a variety of communication protocols, in accordance with an embodiment.

The values and configurations discussed in these non-limiting examples can be varied and are cited merely to illustrate one or more embodiments and are not intended to limit the scope thereof.

Subject matter will now be described more fully hereinafter with reference to the accompanying drawings, which form a part hereof, and which show, by way of illustration, specific example embodiments. Subject matter may, however, be embodied in a variety of different forms and, therefore, covered or claimed subject matter is intended to be construed as not being limited to any example embodiments set forth herein; example embodiments are provided merely to be illustrative. Likewise, a reasonably broad scope for claimed or covered subject matter is intended. Among other issues, subject matter may be embodied as methods, devices, components, or systems. Accordingly, embodiments may, for example, take the form of hardware, software, firmware, or a combination thereof. The following detailed description is, therefore, not intended to be interpreted in a limiting sense.

Throughout the specification and claims, terms may have nuanced meanings suggested or implied in context beyond an explicitly stated meaning. Likewise, phrases such as "in an embodiment" or "in one embodiment" or "in an example embodiment" and variations thereof as utilized herein may or may not necessarily refer to the same embodiment and the phrase "in another embodiment" or "in another example embodiment" and variations thereof as utilized herein may or may not necessarily refer to a different embodiment. It is intended, for example, that claimed subject matter include combinations of example embodiments in whole or in part.

In general, terminology may be understood, at least in part, from usage in context. For example, terms such as "and," "or," or "and/or" as used herein may include a variety of meanings that may depend, at least in part, upon the context in which such terms are used. Generally, "or" if used to associate a list, such as A, B, or C, is intended to mean A, B, and C, here used in the inclusive sense, as well as A, B, or C, here used in the exclusive sense. In addition, the term "one or more" as used herein, depending at least in part upon context, may be used to describe any feature, structure, or characteristic in a singular sense or may be used to describe combinations of features, structures, or characteristics in a plural sense. Similarly, terms such as "a," "an," or "the", again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

As will be discussed in more detail below, the embodiments relate to a cost-effective approach for the detection of magnetic tampering of an energy meter due to AC/DC magnet influences using a shunt and a 3-Dimensional magnetic sensor with detection logic for differentiating between an AC Magnet, a DC Magnet and stray magnetic fields and varying strengths. The embodiments are distinguished from conventional approaches such as described in the background section of this disclosure, wherein mostly one or more Hall effect sensors are used for this purpose, which results in costly process steps with only fixed magnetic thresholds capable of being detected, such that a tampering attempt is detected only when a predetermined magnetic threshold is crossed. The embodiments thus address a gap in conventional AC/DC magnetic tamper detection and immune current measurement solutions by providing an approach that is cost effective and addresses these problems.

FIG. 1 illustrates a block diagram of an energy meter 10 that can perform measurement, billing and communications over a variety of communication protocols, in accordance with an embodiment. As utilized herein, the term 'energy meter' can relate to metering devices that can measure the amount of energy consumed by, for example, a residence, a business, or an industrial facility. Examples of energy meters include gas meters and electricity meters. An electricity meter, which can also be referred to as an electric meter, an electrical meter, or energy meter is a metering device and/or metering system that can measure the amount of electric energy consumed by a residence, a business, or an electrically powered device. Electric utilities typically use electric meters installed at customers' premises for billing and monitoring purposes. A gas meter, on the other hand, is a specialized flow meter, which can be used to measure the volume of fuel gases such as, for example, natural gas and liquefied petroleum gas. Gas meters are typically used at residential, commercial, and industrial buildings that consume fuel gas supplied by a gas utility.

As shown in FIG. 1, the energy meter 10 functions as a metering device or a metering system that can include a power supply 12, a first communication interface 24, a second communication interface 26, display push buttons 14, a central processing unit (CPU) 16, an external memory 22, a magnetic field sensor 18, and a measurement analog front-end (AFE) unit 20. A magnet 21 is also shown in FIG. 1 with respect to the energy meter 10. The magnetic field sensor 18 can be, for example, a 3D magnet sensor. Note that as utilized herein, the terms 'magnet sensor', 'magnetic sensor', 'magnet field sensor' and 'magnetic field sensor' can be utilized interchangeably to refer to the same component or device.

Non-limiting examples of 3D magnet sensors that can be utilized to implement the magnetic field sensor 18 shown in FIG. 1 can include 3-axis magnetic sensors such as disclosed in the document "Magnetic Sensors Product Catalog, Honeywell," which is incorporated herein by reference in its entirety. Another non-limiting example of a 3D magnet sensor that can be utilized as the magnetic field sensor 18 is the HMC1043 three-axis magnetic sensor produced by Honeywell International Inc, and which is disclosed in the document "Three-Axis Magnetic Sensor HMC1043," which is incorporated herein by reference in its entirety.

It should be appreciated that the CPU 16 can be, for example, a central processing unit and/or another processor or processing device such as a microprocessor and/or a microcontroller. Note that the term 'microcontroller' as utilized herein can be referred to as an MCU (for 'microcontroller unit') and can be implemented as a small computer on a single metal-oxide semiconductor (MOS) integrated circuit (IC) chip. A microcontroller or MCU can contain one or more CPUs (processor cores) along with memory and programmable input/output peripherals. Program memory in the form of, for example, ferroelectric RAM, NOR flash or OTP ROM may be included on the chip, as well as a small amount of RAM. Thus, in some embodiments, the CPU 16 can be implemented as a microcontroller or a group of microcontrollers that are associated with the energy meter 10.

The embodiments can be implemented to achieve superior reliability in detecting a magnetic tamper for AC and DC magnetic influences using a robust algorithm with the help of a 3D magnet sensor such as the magnetic field sensor 18. As will be discussed in more detail herein, embodiments can be implemented, which can detect and distinguish both DC and AC magnetic fields. For example, this approach should not detect a changing magnetic field associated with the movement of a DC magnet as an AC magnet.

Embodiments also can configure different tamper thresholds for AC and DC fields. Furthermore, embodiments can include the ability to detect all the conditions by sampling the magnetic field at a much slower rate than a Nyquist rate for sampling a changing magnetic field. Typically, the changing magnetic field may be 50 or 60 Hz and the sampling rate might be much slower such as, for example, ~10 Hz. The embodiments also have minimal memory requirements for storing magnetic field samples.

Figure 2:
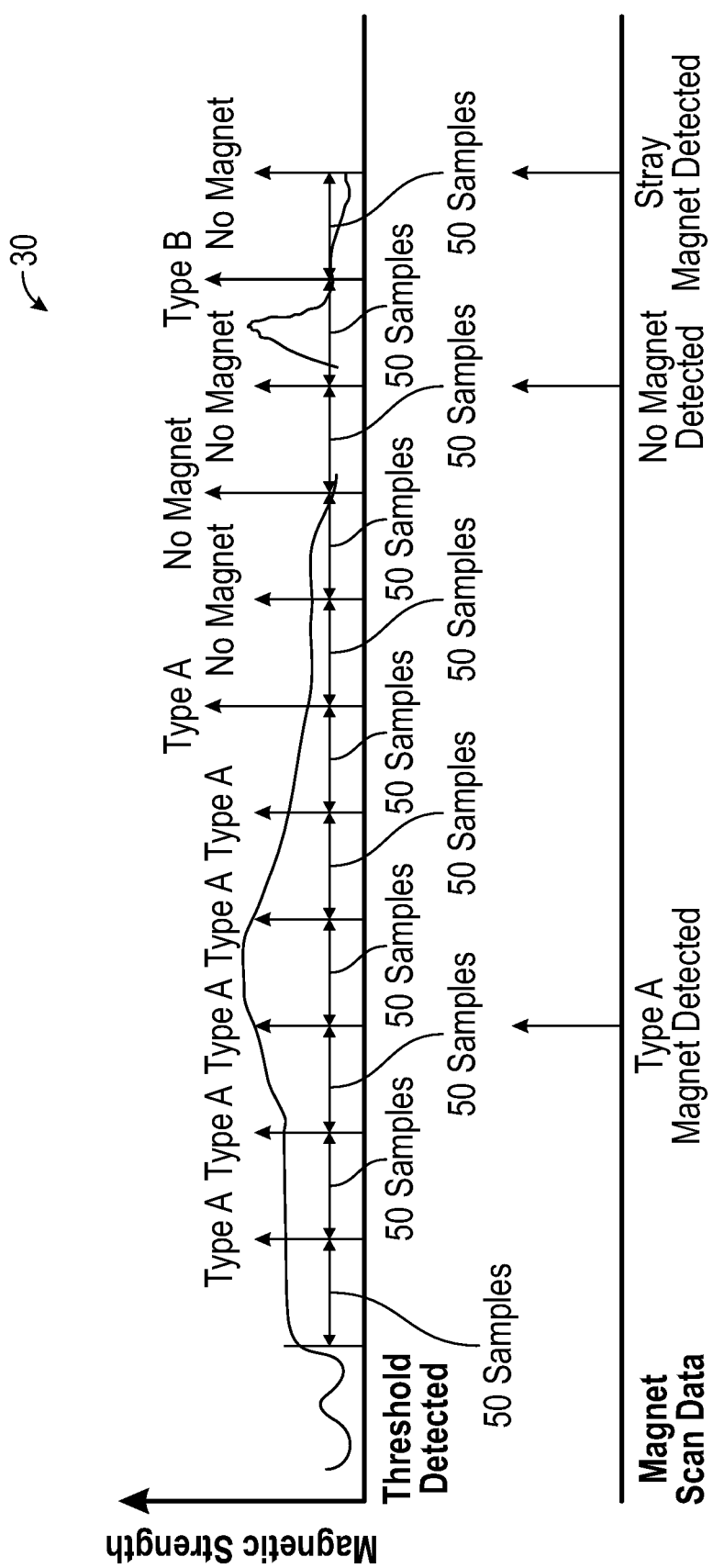
FIG. 2 illustrates a graph depicting data indicative of a high level design for magnet scan and detection in the energy meter shown in FIG. 1, in accordance with an embodiment.

FIG. 2 illustrates a graph 30 depicting data indicative of a high level design for magnet scan and detection in an energy meter such as the energy meter 10 shown in FIG. 1, in accordance with an embodiment. The disclosed approach can be based on a 2-step process involving a first phase and a second phase and the use of a magnetic sensor that can measure a magnetic field in multiple directions 1, 2, or 3.

Figure 3:
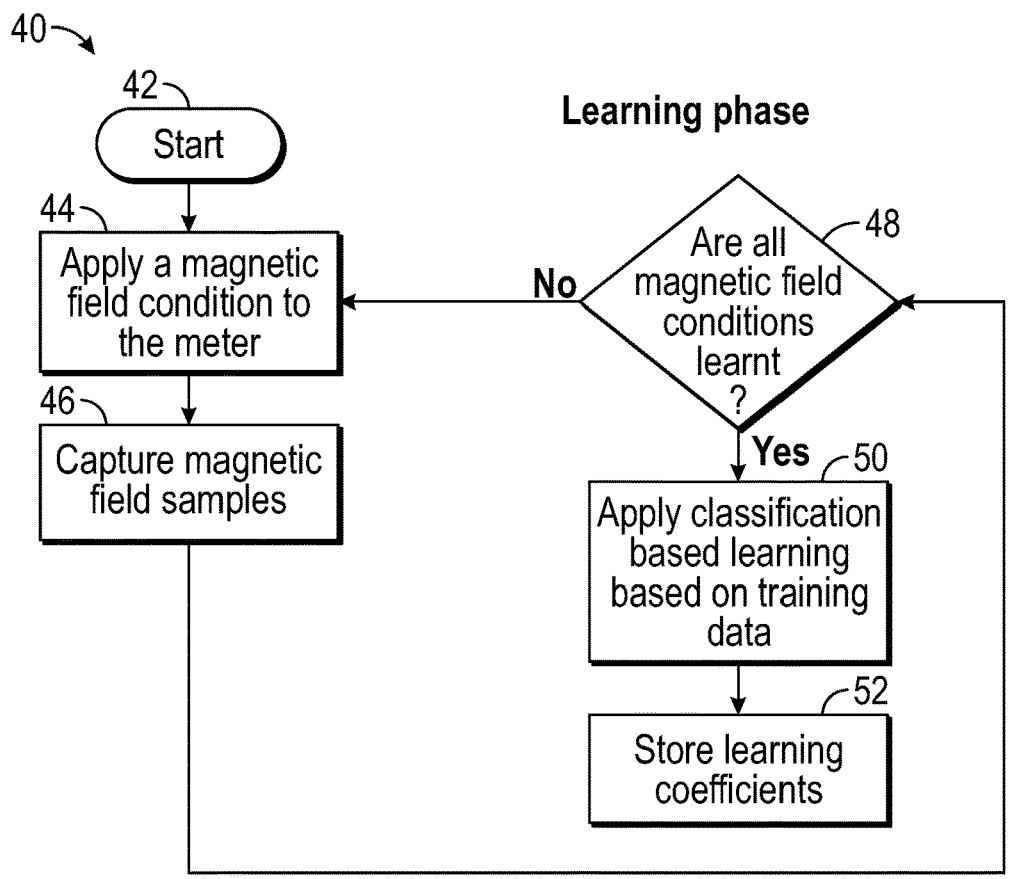
FIG. 3 illustrates a flow chart of operations depicting logical operational steps of a method for implementing a learning phase, in accordance with an embodiment.
Figure 4:
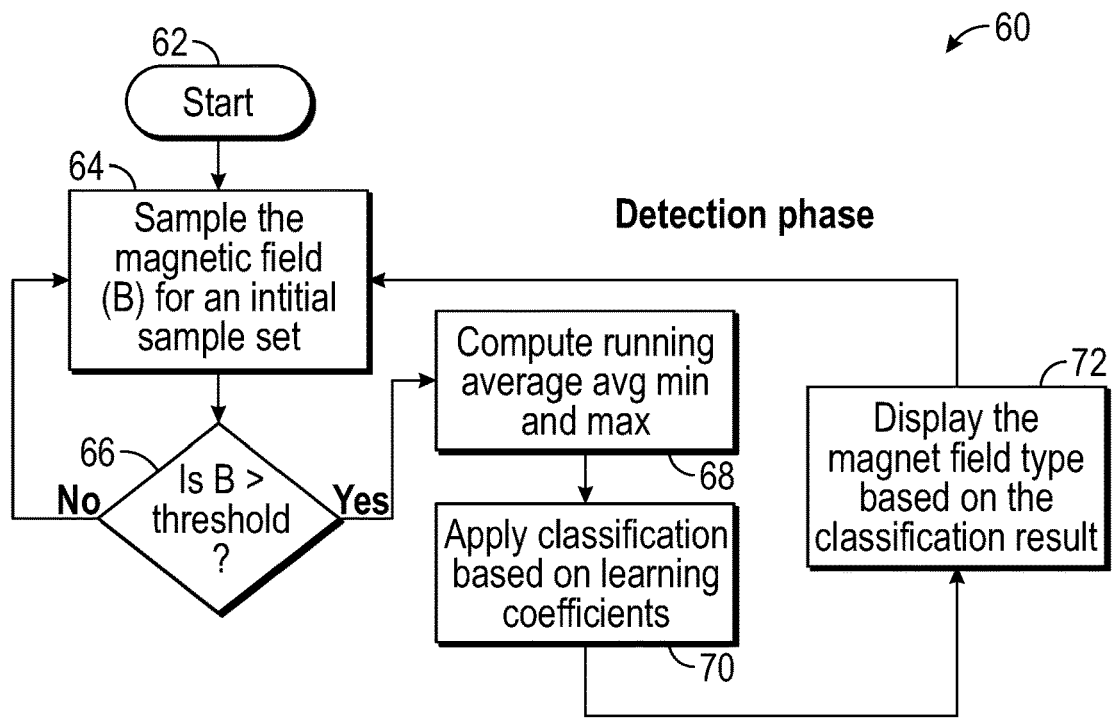
FIG. 4 illustrates a flow chart of operations depicting logical operational steps of a method for implementing a detection phase, in accordance with an embodiment.

The first phase functions as a learning phase (e.g., see method 40 of FIG. 3) and the second phase operates as a detection phase (e.g., see method 60 of FIG. 4). The second phase can involve a groups steps or operations including measuring the magnetic field in 1, 2 or 3 directions by taking multiple samples; calculating the minimum magnetic field strength, the maximum magnetic field strength and the average magnetic field strength; applying thresholds to the AC and DC tamper conditions; and performing classification with a classifier, and making a final decision on the tamper and the type of tamper.

The first phase can involve feeding different types of magnetic fields and gathering sample data in addition to the average magnetic field strength, the minimum magnetic field strength and the maximum magnetic field strength. This data can be used to calculate learning coefficients for simple algorithms such as, for example, an artificial neural network (ANN), selection via proxy (SVP) or other similar classifiers. This can be then used in the detection phase to attain the actual classification of the magnet tamper.

In an embodiment, the magnetic strength can be sampled from the magnetic field sensor 18 at, for example, every 100 ms. Once the magnetic strength exceeds a minimum threshold, processing of a sample can begin. The sample processing can involve averaging of the magnetic strength, obtaining the minimum and maximum magnetic strength of samples over a period of 50 seconds, as depicted in the example shown in graph 30 of FIG. 2.

Based on the samples, an average magnetic strength, a minimum magnetic strength, a maximum magnetic strength, the type of magnetic field (AC, DC), and/or the presence of a stray magnet or no magnetic field condition may be detected. The sample processing can be repeated, for example, for 2-3 times for guaranteed detection. Once three detection cycles are completed with the same type of magnet (AC/DC) detected, the resultant magnet type with the average magnetic field can be updated in the magnet scan results. The magnet scan results can be then compared with respective magnetic thresholds (AC or DC). If the magnet scan results are greater than the respective magnetic thresholds, this indicates that a magnetic tamper has been detected.

The tamper detection phase occurs when the energy meter 10 is installed and live. The energy meter 10 can scan the magnet 21 placed near its proximity and can detect the type of magnetic influence (i.e., whether AC/DC). If detected, a magnet tamper event can be logged. Note this approach can also perform push notifications to a head end system to indicate the tamper event. Note that the term 'head end system' as utilized herein can relate to hardware and software that can receive a stream of meter data from the energy meter 10 brought back to a utility, for example, through advanced metering infrastructure (AMI). A head-end system can perform a limited amount of data validation before either making the data available for other systems to request or pushing the data out to other systems.

FIG. 3 illustrates a flow chart of operations depicting logical operational steps of a method 40 for implementing a learning phase, in accordance with an embodiment. As shown at block 42, the process can begin. Thereafter, as shown at block 44, as step or operation can be implemented in a magnetic field condition is applied to the energy meter 10. Next, as depicted at block 46, a step or operation can be implemented to capture magnetic field samples. Then, as illustrated at decision block 48, a step or operation can be implemented to determine if all magnetic field conditions have been learnt. If "no", then the steps or operations shown at block 44 block 46, and so on, can be repeated. If "yes", the step or operation indicated at block 50 can be implemented in which classification-based learning can be applied based on the training data. Thereafter, as shown at block 52, a step or operation can be implemented to store learning coefficients.

FIG. 4 illustrates a flow chart of operations depicting logical operational steps of a method 60 for implementing a detection phase, in accordance with an embodiment. As shown at block 62, a step or operation can be implemented. Then, as depicted at block 64, a step or operation can be implemented to sample the magnetic field (B) for an initial sample set. Thereafter, as illustrated at decision block 66, a step or operation can be implemented to determine when B is greater than a threshold. If B is not greater than the threshold, then the step or operation shown at block 64 can be repeated. If, however, B is greater than the threshold, the step or operation depicted at block 68 can be implemented. That is, as shown at block 68, a running average can be calculated including the average magnetic strength, the minimum magnetic strength, and the maximum magnetic strength.

Following processing of the step or operation shown at block 68, a step or operation can be implemented to apply classification based on the learning coefficients (i.e., the stored learning coefficients from block 52 of FIG. 3). Thereafter, as shown at block 72, a step or operation can be implemented to display the magnet field type based on the classification results. Following processing of the step or operation shown at block 72, the steps or operations beginning with those shown at block 64, block 66 and so on, can be repeated.

Figure 5:
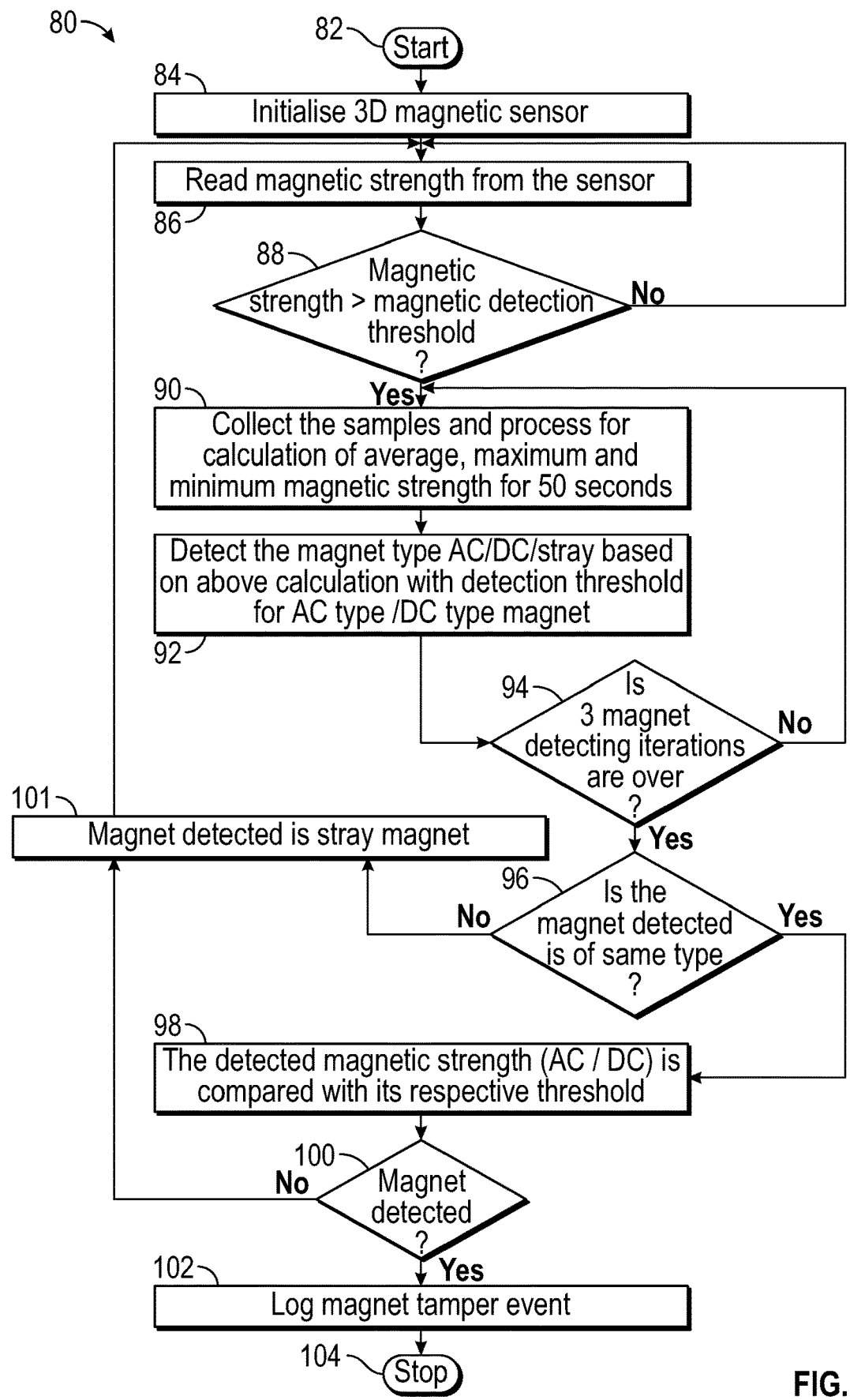
FIG. 5 illustrates a flow chart of operations depicting logical operational steps or a method for classification of magnet tampering conditions on an energy meter device, in accordance with an embodiment.

FIG. 5 illustrates a flow chart of operations depicting logical operational steps or a method 80 for classification of magnet tampering conditions on an energy meter device, in accordance with an embodiment. As shown at block 82, the process can begin. Thereafter, as shown at block 84, a step or operation can be implemented to initialize the 3D magnetic sensor 18 shown in FIG. 1. Next, as depicted at block 86, a step or operation can be implemented to read the magnetic field strength from the magnetic sensor 18.

Then, as illustrated at decision block 88, a step or operation can be implemented to determine when the magnetic field strength is greater than the magnetic detection threshold. If the magnetic field strength is not greater than the magnet detection threshold, the step or operation shown at block 86 can be repeated, and so on. If, however, the magnetic field strength is greater than the magnet detection threshold, then the step or operation depicted at block 90 can be implemented, in which samples can be collected and processed for calculation of the average magnetic field strength, the maximum magnetic field strength, and the minimum magnetic field strength for 50 seconds.

As shown next at block 92, a step or operation can be implemented to detect the magnet type (e.g., AC/DC/stray, etc.) based on the above calculation with the detection threshold for the AC type magnet/DC type magnet. Thereafter, as illustrated at decision block 94, a step or operation can be implemented to determine if three magnet detection iterations have been completed. If "no", then, the steps or operations shown at block 90, block 92, and so on can be repeated. If "yes", then as depicted at decision block 96, a step or operation can be implemented to determine if the magnet detected is of the same type. If not, then a step or operation can be implemented, as illustrated at block 101 in which a determination is made that the magnet detected is a stray magnet. Following processing of the step or operation depicted at block 101, the steps or operations beginning with block 86, and so on, can be repeated.

If it is determined, however, that the magnet detection is of the same type, as shown at block 96, a step or operation can be implemented as indicated next at block 98, in which the detected magnetic field strength (AC/DC) can be compared with its respective threshold. Thereafter, as shown at decision block 100, a step or operation can be implemented to determine when a magnet (e.g., magnet 21 in FIG. 1) has been detected. If the answer is "no" with respect to decision block 100, then the step or operations shown at block 101, block 86, and so on, can be repeated. If the answer is "yes" with respect to decision block 100, then a step or operation can be implemented to log a magnet tamper event, as shown at block 102. The process can then end, as depicted at block 104.

Figure 6:
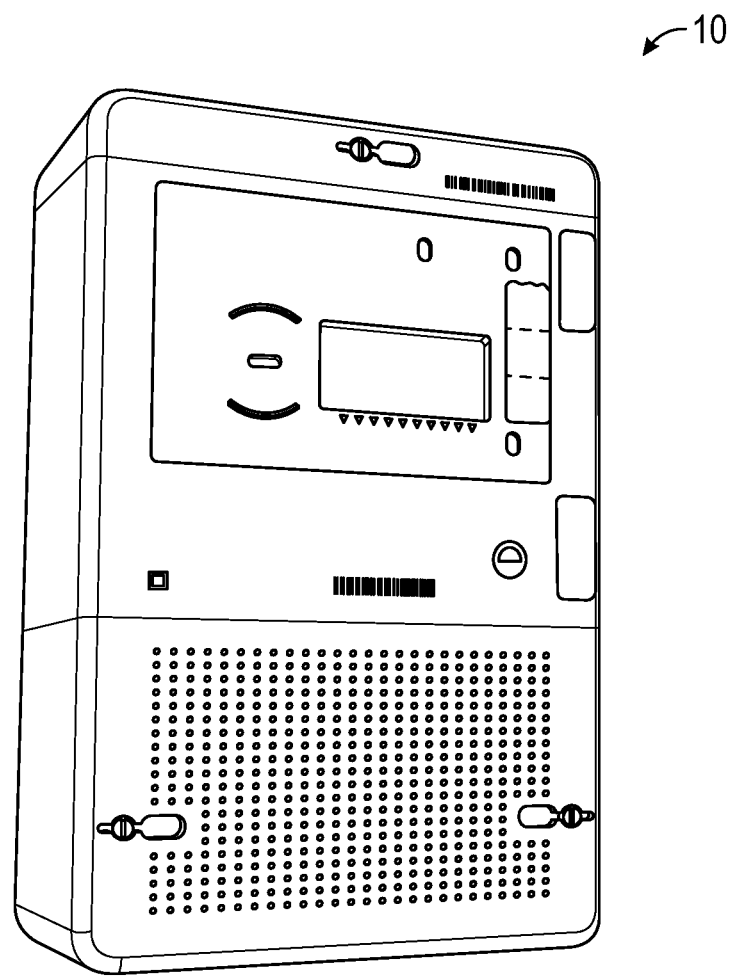
FIG. 6 illustrates a perspective view of the energy meter shown in FIG. 1, in accordance with an embodiment.

FIG. 6 illustrates a perspective view of the energy meter 10 shown in FIG. 1, in accordance with an embodiment. Note that FIG. 6 is presented herein provide a pictorial example of one possible embodiment of the energy meter 10. It can be appreciated that other types of energy meters may be utilized to implement energy meter 10 and that the configuration shown in FIG. 6 is provided for general illustrative and exemplary purposes only.

As can be appreciated by one skilled in the art, some embodiment may be implemented in the context of a method, data processing system, or computer program product. Accordingly, embodiments may take the form of an entirely hardware embodiment, an entirely software embodiment or an embodiment combining software and hardware aspects all generally referred to herein as a "circuit" or "module." Furthermore, embodiments may in some cases take the form of a computer program product on a computer-usable storage medium having computer-usable program code embodied in the medium. Any suitable computer readable medium may be utilized including hard disks, USB Flash Drives, DVDs, CD-ROMs, optical storage devices, magnetic storage devices, server storage, databases, etc.

Computer program code for carrying out operations of the present invention may be written in an object oriented programming language (e.g., Java, C++, etc.). The computer program code, however, for carrying out operations of embodiments may also be written in procedural programming languages, such as the "C" programming language or in a visually oriented programming environment, such as, for example, Visual Basic.

The program code may execute entirely on the user's computer, partly on the user's computer, as a stand-alone software package, partly on the user's computer and partly on a remote computer or entirely on the remote computer. In the latter scenario, the remote computer may be connected to a user's computer through a bidirectional data communications network such as a local area network (LAN) or a wide area network (WAN), a wireless local area network (WLAN), wireless data network e.g., Wi-Fi, WiMAX, 802.xx, and/or a cellular network or the bidirectional connection may be made to an external computer via most third party supported networks (for example, through the Internet utilizing an Internet Service Provider).

Note that in some embodiments, the steps, operations or instructions described and illustrated herein can be stored in a memory such as the external memory 22 shown in FIG. 1 and processed by, for example, the CPU 16 also shown in FIG. 1. In some embodiments, the various steps, operations and instructions discussed herein can be implemented via firmware running on a single microcontroller or a group of microcontrollers (as discussed previously the CPU 16 can be implemented in some embodiments as a microcontroller).

The term 'firmware' as utilized herein can relate to a class or computer software can provide low-level control for specific hardware associated with the energy meter 10. Such firmware can either provide a standardized operating environment for more complex device software associated with the energy meter 10, or for a less complex energy meter, can act as the device's complete operating system, performing all or most control, monitoring and data manipulation functions.

The embodiments are described at least in part herein with reference to flowchart illustrations and/or block diagrams of methods, systems, and computer program products and data structures according to embodiments of the invention. It will be understood that each block or feature of the illustrations, and combinations of blocks or features, can be implemented by computer program instructions. These computer program instructions may be provided to a processor of, for example, a general-purpose computer, special-purpose computer, or other programmable data processing apparatus to produce a machine, such that the instructions, which execute via the processor of the computer or other programmable data processing apparatus, create means for implementing the functions/acts specified in the block or blocks or elsewhere herein. To be clear, the disclosed embodiments can be implemented in the context of, for example a special-purpose computer or a general-purpose computer, or other programmable data processing apparatus or system. For example, in some embodiments, a data processing apparatus or system can be implemented as a combination of a special-purpose computer and a general-purpose computer.

These computer program instructions may also be stored in a computer-readable memory that can direct a computer or other programmable data processing apparatus to function in a particular manner, such that the instructions stored in the computer-readable memory produce an article of manufacture including instruction means which implement the function/act specified in the various block or blocks, flowcharts, and other architecture illustrated and described herein.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions/acts specified in the block or blocks.

The flowchart and block diagrams in the figures herein illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Figure 7:
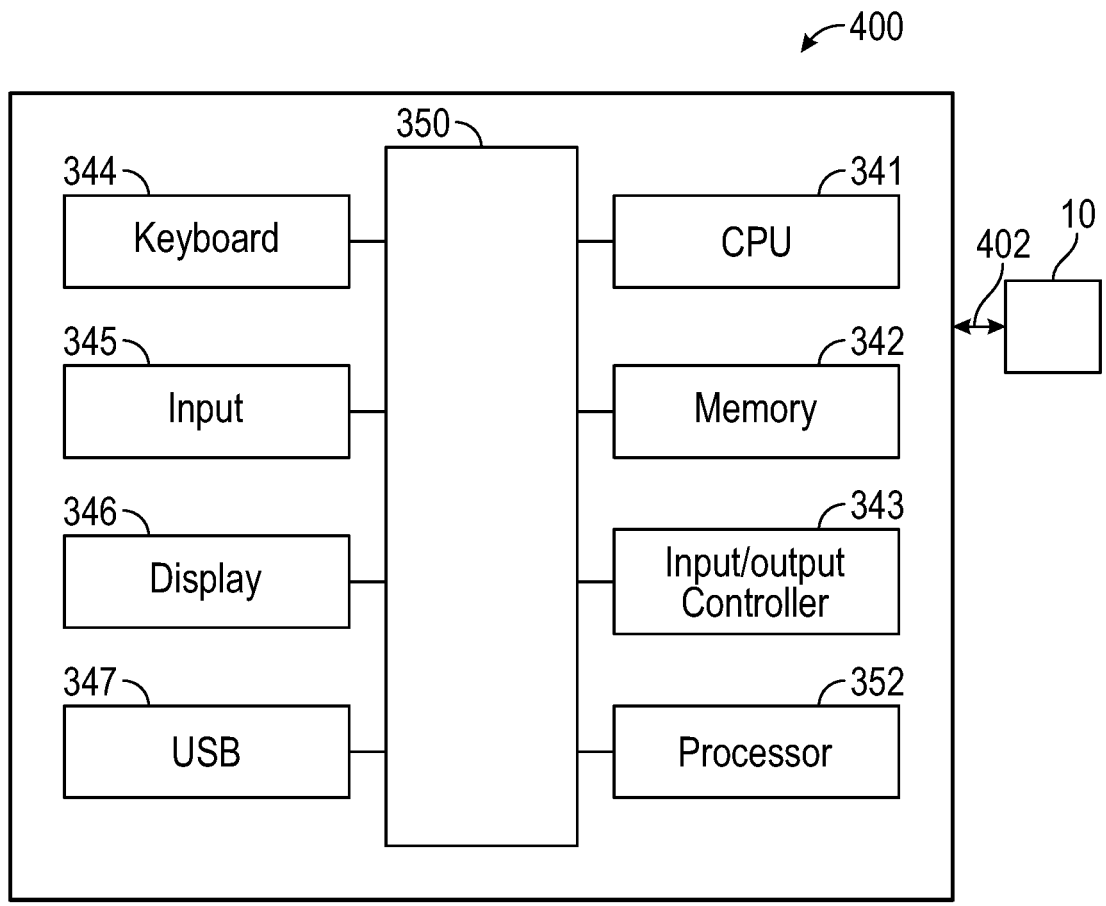
FIG. 7 illustrates a schematic view of a data-processing system, in accordance with an embodiment.
Figure 8:
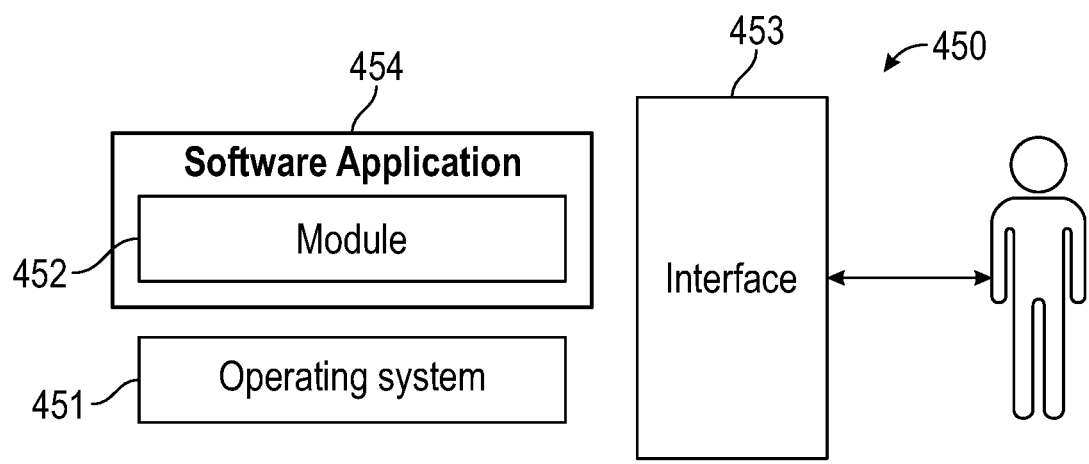
FIG. 8 illustrates a schematic view of a software system including a module, an operating system, and a user interface, in accordance with an embodiment.

FIG. 7 and FIG. 8 are shown only as exemplary diagrams of data-processing environments in which example embodiments may be implemented. It should be appreciated that FIG. 7 and FIG. 8 are only exemplary and are not intended to assert or imply any limitation regarding the environments in which aspects or embodiments of the disclosed embodiments may be implemented. Many modifications to the depicted environments may be made without departing from the spirit and scope of the disclosed embodiments.

As illustrated in FIG. 7, an embodiment may be implemented in the context of a data-processing system 400 that can include, for example, one or more processors such as a CPU (Central Processing Unit) 341 and/or other another processor 352 (e.g., microprocessor, microcontroller etc.), a memory 342, an input/output controller 343, a peripheral USB (Universal Serial Bus) connection 347, a keyboard 344 and/or another input device 345 (e.g., a pointing device, such as a mouse, track ball, pen device, etc.), a display 346 (e.g., a monitor, touch screen display, etc.) and/or other peripheral connections and components. In a preferred embodiment, the data-processing 400 can communicate with the energy meter 10 and send to and receive data from the energy meter 10.

As illustrated, the various components of data-processing system 400 can communicate electronically through a system bus 350 or similar architecture. The system bus 350 may be, for example, a subsystem that transfers data between, for example, computer components within data-processing system 400 or to and from other data-processing devices, components, computers, etc. The data-processing system 400 may be implemented in some embodiments as, for example, a server in a client-server based network (e.g., the Internet) or in the context of a client and a server (i.e., where aspects are practiced on the client and the server). For example, in some embodiments, the data-processing system 400 may communicate with the energy meter 10. In this case, the bidirectional arrow 402 shown in FIG. 7 may be representative of the Internet or another form of electronics communications (e.g., a wireless communications network).

In some example embodiments, data-processing system 400 may be, for example, a standalone desktop computer, a laptop computer, a smartphone, a tablet computing device, a networked computer server, and so on, wherein each such device can be operably connected to and/or in communication with a client-server based network or other types of networks (e.g., cellular networks, Wi-Fi, etc.). The data-processing system 400 can communicate with other devices such as, for example, the energy meter 10. Communication between the data-processing system 400 and the energy meter 10 can be bidirectional, as indicated by the double arrow 402. Such bidirectional communications may be facilitated by, for example, a computer network, including wireless bidirectional data communications networks.

FIG. 8 illustrates a computer software system 450 that can be used for directing the operation of the data-processing system 400 depicted in FIG. 7. A software application 454, stored for example in the memory 342 can include one or more modules such as a module 452. The computer software system 450 also can include a kernel or operating system 451 and a shell or interface 453. One or more application programs, such as software application 454, may be "loaded" (i.e., transferred from, for example, mass storage or another memory location into the memory 342) for execution by the data-processing system 400. The data-processing system 400 can receive user commands and data through the interface 453; these inputs may then be acted upon by the data-processing system 400 in accordance with instructions from operating system 451 and/or software application 454. In some embodiments, the interface 453 can serve to display results, whereupon a user 459 may supply additional inputs or terminate a session. The software application 454 can include module(s) 452, which can, for example, implement instructions, steps or operations such as those discussed herein. Module 452 may also be composed of a group of modules and/or sub-modules.

The following discussion is intended to provide a brief, general description of suitable computing environments in which the system and method may be implemented. The disclosed embodiments can be described in the general context of computer-executable instructions, such as program modules, being executed by a single computer. In most instances, a "module" can constitute a software application, but can also be implemented as both software and hardware (i.e., a combination of software and hardware).

Generally, program modules include, but are not limited to, routines, subroutines, software applications, programs, objects, components, data structures, etc., that can perform tasks, or which can implement data types and instructions. Moreover, those skilled in the art will appreciate that the disclosed method and system may be practiced with other computer system configurations, such as, for example, handheld devices, multi-processor systems, data networks, microprocessor-based or programmable consumer electronics, networked PCs, minicomputers, mainframe computers, servers, and the like.

Note that the term module as utilized herein may refer to a collection of routines and data structures that perform a particular task or implements a particular data type. Modules may be composed of two parts: an interface, which lists the constants, data types, variable, and routines that can be accessed by other modules or routines, and an implementation, which may be private (e.g., accessible only to that module) and which can include source code that implements the routines in the module. The term module can also relate to an application, such as a computer program designed to assist in the performance of a specific task, such as implementing the steps, operations or instructions described herein.

The method 40, the method 60 and/or the method 80 shown respectively in FIG. 3, FIG. 5, and FIG. 5, can be implemented at least in part by a module (or group of modules). A module such as the module 452 shown in FIG. 8 can implement for example, the instructions, steps or operations depicted in FIG. 3 with respect to blocks 42, 44, 46, 48, 50, and 52. Similarly, the method 60 depicted in FIG. 4 can be implemented as a module or a group of modules. For example, a module such as the module 452 shown in FIG. 8 can implement the instructions, steps or operations depicted in FIG. 4 with respect to blocks 62, 64, 66, 68, 70, and 72. The steps or operations shown in FIG. 5 with respect to blocks 82, 84, 86, 88, 90, 92, 94, 96, 98, 100, 101, 102, and 104 can also be implemented by a module such as the module 452 shown in FIG. 8.

Embodiments can be implemented at the stack level in the context of a hardware device with embedded software that can be connected securely to the 'cloud' via a wired connection or a wireless connection. Embodiments can also be implemented as embedded software that runs in a device/unit (e.g., firmware). Embodiments can also be implemented in an IoT (Internet of Things) application. Embodiments may also be implemented at the IoT stack level (e.g., hardware device with embedded software that can be connected securely to the cloud via a wired connections or a wireless connection).

It will be appreciated that variations of the above-disclosed and other features and functions, or alternatives thereof, may be desirably combined into many other different systems or applications. It will also be appreciated that various presently unforeseen or unanticipated alternatives, modifications, variations or improvements therein may be subsequently made by those skilled in the art which are also intended to be encompassed by the following claims.

What is claimed is:

1. A method for detecting tampering of an energy meter and for distinguishing between different types of a magnet tamper event in the energy meter, the method comprising:
in a first phase:
initializing, using a circuitry, a shunt and a three-dimensional (3D) magnetic sensor to gather magnetic field sample data, an average magnetic field strength, a minimum magnetic field strength, and a maximum magnetic field strength from at least one magnetic field condition applied to the energy meter, and to measure a magnetic field in at least one of a plurality of directions;
calculating, using the circuitry, learning coefficients from the magnetic field sample data and the average magnetic field strength, the minimum magnetic field strength, and the maximum magnetic field strength to classify with a classifier, magnet tampering conditions with respect to the energy meter;
in a second phase:
identifying, using the circuitry, the magnet tamper event with respect to the energy meter when the magnet tampering condition classified by the classifier is greater than a magnetic detection threshold associated with the detection of tampering of the energy meter; and
displaying, using the circuitry, the magnet tamper event based on a result of applied magnet tampering condition classification, wherein the displaying includes display of the different types of the magnet tamper event with respect to the energy meter.

2. The method of claim 1 wherein the first phase comprises a learning phase.

3. The method of claim 1 wherein the second phase comprises a detection phase.

4. The method of claim 1 wherein the second phase further comprises:
measuring the magnetic field in the at least one of the plurality of directions by taking a plurality of samples with the magnetic sensor;
calculating the average magnetic field strength, the minimum magnetic field strength, and the maximum magnetic field strength; and
applying thresholds to the magnet tampering conditions including at least one of: an AC tamper condition and a DC tamper condition.

5. The method of claim 4 wherein the second phase further comprises:
performing a classification using the classifier; and
making a final decision regarding the magnet tampering condition classified by the classifier including the type of magnet tamper event.

6. The method of claim 1 wherein the second phase further comprises:
measuring the magnetic field in the at least one of the plurality of directions by taking a plurality of samples with the magnetic sensor;
calculating the average magnetic field strength, the minimum magnetic field strength, and the maximum magnetic field strength;
applying thresholds to the magnet tampering conditions including at least one of: an AC tamper condition and a DC tamper condition;
performing a classification using the classifier; and
making a final decision regarding the magnet tampering condition classified by the classifier including the type of magnet tamper event.

7. The method of claim 1 further comprising detecting a magnet type based on the calculating of the average magnetic field strength, the minimum magnetic field strength, and the maximum magnetic field strength.

8. A system for detecting tampering of an energy meter and for distinguishing between different types of a magnet temper event in the energy meter, the system comprising:
a circuitry, the energy meter, a classifier, a shunt and a three-dimensional (3D) magnetic sensor that measures a magnetic field in at least one of a plurality of directions, wherein:
in a first phase:
the circuitry is configured to:
initialize the magnetic sensor to gather magnetic field sample data, an average magnetic field strength, a minimum magnetic field strength, and a maximum magnetic field strength from at least one magnetic field condition applied to the energy meter by the magnetic sensor; and
calculate learning coefficients from the magnetic field sample data and the average magnetic field strength, the minimum magnetic field strength, and the maximum magnetic field strength; and
the classifier is configured to use the calculated learning coefficients to classify magnet tampering conditions with respect to the energy meter; and
in a second phase:
the circuitry is further configured to identify the magnet tamper event with respect to the energy meter when the magnet tampering condition classified by the classifier is greater than a magnetic detection threshold associated with the detection of tampering of the energy meter; and
display, using the circuitry, the magnet tamper event based on a result of applied magnet tampering condition classification, wherein the displaying includes display of the different types of the magnet tamper event with respect to the energy meter.

9. The system of claim 8 wherein the first phase comprises a learning phase.

10. The system of claim 8 wherein the second phase comprises a detection phase.

11. The system of claim 8 wherein the second phase further comprises:
measuring the magnetic field in the at least one of the plurality of directions by taking a plurality of samples with the magnetic sensor;
calculating the average magnetic field strength, the minimum magnetic field strength, and the maximum magnetic field strength; and
applying thresholds to the magnet tampering conditions including at least one of: an AC tamper condition and a DC tamper condition.

12. The system of claim 11 wherein the second phase further comprises:
   performing a classification using the classifier; and
   making a final decision regarding the magnet tampering condition classified by the classifier including the type of magnet tamper event.

13. The system of claim 8 wherein the second phase further comprises:
   measuring the magnetic field in the at least one of the plurality of directions by taking a plurality of samples with the magnetic sensor;
   calculating the average magnetic field strength, the minimum magnetic field strength, and the maximum magnetic field strength;
   applying thresholds to the magnet tampering conditions including at least one of: an AC tamper condition and a DC tamper condition;
   performing a classification using the classifier; and
   making a final decision regarding the magnet tampering condition classified by the classifier including the type of magnet tamper event.

14. The system of claim 8 wherein a magnet type is detected based on the calculating of the average magnetic field strength, the minimum magnetic field strength, and the maximum magnetic field strength.

15. A non-transient, computer-readable storage medium having instructions stored thereon to detect tampering of an energy meter and for distinguishing between different types of a magnet tamper event in the energy meter, that when executed by a computer system cause the computer system to:
   in a first phase:
   initialize, using a circuitry, a shunt and a three-dimensional (3D) magnetic sensor to gather magnetic field sample data, an average magnetic field strength, a minimum magnetic field strength, and a maximum magnetic field strength from at least one magnetic field condition applied to the energy meter, and to measure a magnetic field in at least one of a plurality of directions;
   calculate, using the circuitry, learning coefficients from the magnetic field sample data and the average magnetic field strength, the minimum magnetic field strength, and the maximum magnetic field strength to classify with a classifier, magnet tampering conditions with respect to the energy meter; and
   in a second phase:
   identify, using the circuitry, the magnet tamper event with respect to the energy meter when the magnet tampering condition classified by the classifier is greater than a magnetic detection threshold associated with the detection of tampering of the energy meter; and
   display, using the circuitry, the magnet tamper event based on a result of applied magnet tampering condition classification, wherein the displaying includes display of the different types of the magnet tamper event with respect to the energy meter.

16. The non-transient, computer-readable storage medium of claim 15, wherein the first phase comprises a learning phase and the second phase comprises a detection phase.

17. The non-transient, computer-readable storage medium of claim 15, wherein the second phase further comprises:
   measuring the magnetic field in the at least one of the plurality of directions by taking a plurality of samples with the magnetic sensor;
   calculating the average magnetic field strength, the minimum magnetic field strength, and the maximum magnetic field strength;
   applying thresholds to the magnet tampering conditions including at least one of: an AC tamper condition and a DC tamper condition;
   performing a classification using the classifier; and
   making a final decision regarding the magnet tampering condition classified by the classifier including the type of magnet tamper event.

* * * * *